(12) United States Patent
Fujii

(10) Patent No.: US 6,590,760 B1
(45) Date of Patent: Jul. 8, 2003

(54) JOINT STRUCTURE OF CERAMICS AND METAL AND INTERMEDIATE INSERTION MEMBER USED IN THIS JOINT STRUCTURE

(75) Inventor: Tomoyuki Fujii, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 407 days.

(21) Appl. No.: 09/580,073

(22) Filed: May 30, 2000

(30) Foreign Application Priority Data

Jun. 1, 1999 (JP) .......................... 11-153542

(51) Int. Cl.⁷ .................... H01T 23/00; H01G 3/00; B25B 11/00
(52) U.S. Cl. ..................... 361/234; 361/233; 269/8
(58) Field of Search ................... 361/233, 234; 269/8; 279/128; 29/825, 826

(56) References Cited

U.S. PATENT DOCUMENTS

| 4,600,967 A | * | 7/1986 | Ling et al. ............... 361/321.4 |
| 5,231,690 A | * | 7/1993 | Soma et al. ................ 118/725 |
| 5,995,357 A | | 11/1999 | Ushikoshi et al. |

FOREIGN PATENT DOCUMENTS

| JP | 8-277173 A | 10/1996 |
| JP | 10-209255 A | 8/1998 |
| JP | 11-12053 A | 1/1999 |

\* cited by examiner

*Primary Examiner*—Brian Sircus
*Assistant Examiner*—Danny Nguyen
(74) *Attorney, Agent, or Firm*—Burr & Brown

(57) ABSTRACT

A joint structure of a first member includes a substrate made of ceramics and a metal embedded member embedded in the substrate, in which a part of the metal embedded member is exposed to a joint surface of the first member, and a second member made of metal. The joint structure includes: an intermediate insertion member interposed between the joint surface of the first member and the second member; a first joint layer which joins the joint surface of the first member and the intermediate insertion member; and a second joint layer which joins the second member and the intermediate insertion member. In the joint structure, the intermediate insertion member is made of a laminated member of a plurality of ceramics layers and at least one metal layer interposed between respective ceramics layers.

17 Claims, 10 Drawing Sheets

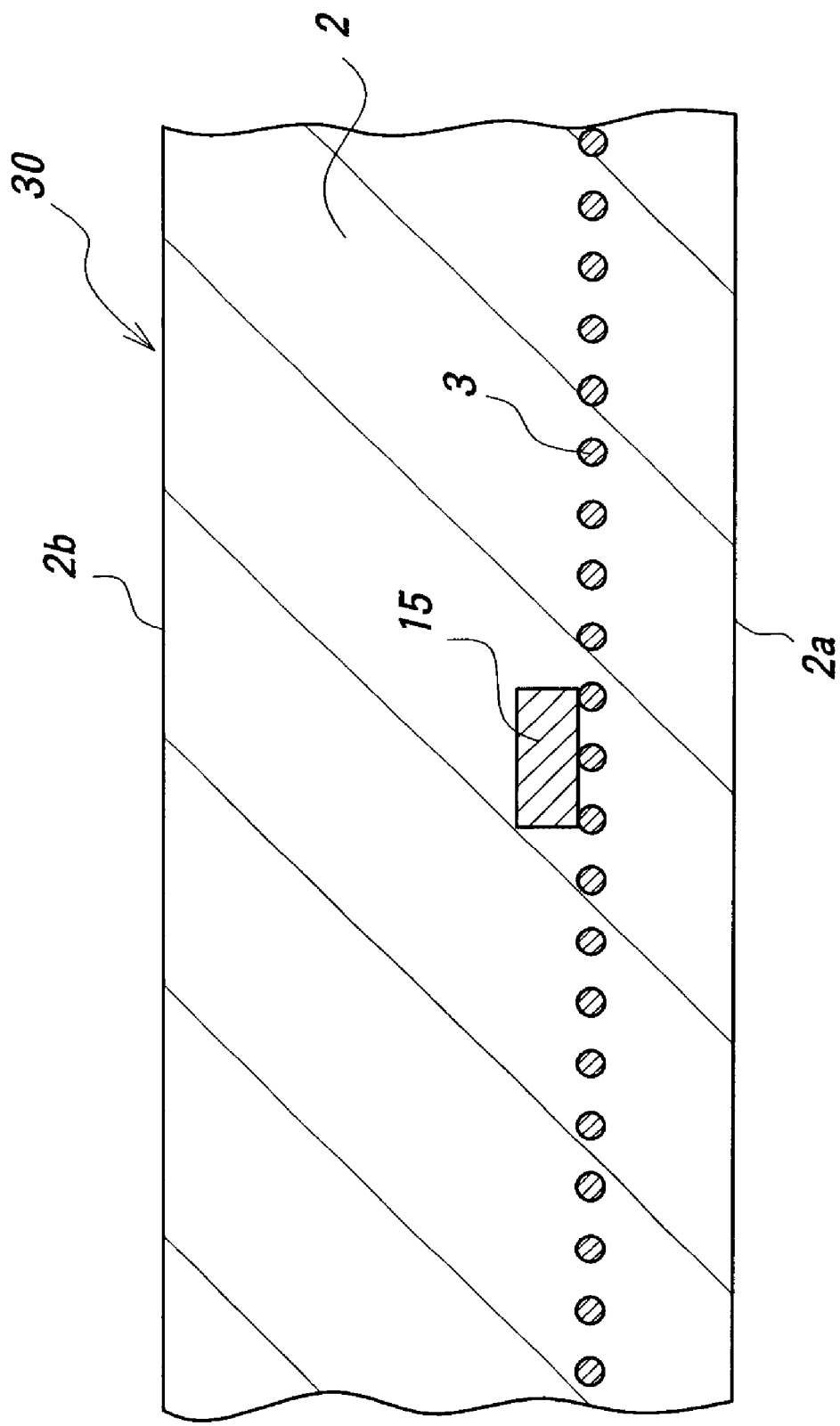

JOINT STRUCTURE OF CERAMICS AND METAL AND INTERMEDIATE INSERTION MEMBER USED IN THIS JOINT STRUCTURE

BACKGROUND OF THE INVENTION

1. Field of the Invention

The present invention relates to a joint structure of ceramics and metal and an intermediate insertion member used in this joint structure.

2. Description of Related Art

Nowadays, electrostatic chucks are being used to absorb and hold semiconductor wafers in transferring, light-exposing, film-forming such as CVD and sputtering, fine processing, washing, etching, dicing, etc. for semiconductor wafers. Dense ceramics are noted for substrates of such electrostatic chucks. Particularly, in the semiconductor producing apparatus, a halogen based corrosive gas such as $CIF_3$, $CF_4$, $NF_3$ is often used as an etching gas. In order to rapidly heat and cool the semiconductor wafer while being held by such a substrate, the substrate of the electrostatic chuck is desired to have high heat conductivity. Further, it is desired that the substrate has such thermal shock resistance as not being destroyed by rapid temperature changes. Dense aluminum nitride and alumina have high corrosion resistance against the halogen based corrosion gas mentioned above.

In the field of the semiconductor producing apparatuses, susceptors in which built-in high frequency electrodes for generating plasma have been practically used. In the field of such high frequency electric power generating apparatuses, ceramics heaters in which a metal resistor is embedded in a substrate of aluminum nitride or alumina for controlling the temperature of a wafer in each process.

In these apparatuses, it is necessary that the metal electrode is em bedded in the ceramic substrate made of aluminum nitride or the like, and that the metal electrode is electrically coupled to an external electric power supply connector. However, a coupling portion for this purpose is exposed to a heat cycle between extreme high temperatures and low temperatures in an oxidative atmosphere and further in a corrosive gas atmosphere. Such a joint portion is desired to maintain high joining strength and excellent electric coupling performance for a long time period even under such a bad condition.

The present inventors have continuously studied the coupling structures as mentioned above. For example, Japanese Patent Laid-Open Publication No. 8-277,173 (JP-A-8-277, 173) proposed that a mesh or net metal electrode is embedded in an AIN ceramics, while a part of the mesh or net metal electrode is exposed, ants the exposed mesh or net portion and the AIN ceramics are brazed to a tip face of the electric power supply connector. In the techniques mentioned above, the proposed brazing methods have a high corrosive resistance against the halogen based corrosive gas and its plasma. Moreover, the present inventors further proposed, in Japanese Patent Application No. 9-12,769 (U.S. Ser No. 09/013, 045), a specific connector-metal electrode joint structure which can maintain high joining strength and excellent conductive performance even if high temperatures or heat cycle is applied thereto under an oxidative atmosphere. Further, the present inventors further proposed, in Japanese Patent Laid-Open Publication No. 11-12,053 (U.S. Ser. No. 09/095,157), a specific joining structure which can prevent an erosion of a metal embedded member in ceramics.

Under specific conditions in which the joint structure mentioned above are used, there are cases such that a heat cycle between high temperature and low temperature is repeated at a great number of times or for a long time, such that temperature differences, temperature descending rate and temperature ascending rate at respective heat cycles are extremely large, and such that a high mechanical stress is applied to a terminal. In these cases, there is a possibility such that cracks are generated in the brazing material at a joint portion between metal terminal and ceramics and a corrosive gas is penetrated through the brazing material. Moreover, there is also a possibility such that cracks are generated in respective ceramics members which constitute the joint portion.

SUMMARY OF THE INVENTION

An object of the present invention is to improve a durability against heat cycle and mechanical stress applied to a joint portion in a joint structure of a first member, having a substrate made of ceramics and a metal embedded member embedded in the substrate, in which a part of the metal embedded member is exposed to a joint surface of the first member, and a second member made of metal.

According to the invention, the above-discussed joint structure of the first member includes an intermediate insertion member interposed between the joint surface of the firsts member and the second member. A first joint layer joins the joint surface of the first member and the intermediate insertion member. A second joint layer joins the second member and the intermediate insertion member. The intermediate insertion member is made of a laminated member of a plurality of ceramics layers and at least one metal layer interposed between respective ceramics layers.

Moreover, according to the invention, an intermediate insertion member includes a laminated structure of a plurality of ceramics layers and at least one metal layer interposed between respective ceramics layers.

BRIEF DESCRIPTION OF THE DRAWINGS

FIG. 4 is a cross sectional view illustrating a state such that a formed body 15 of metal powders and a metal electrode 3 are embedded in a ceramics formed body 30;

DESCRIPTION OF THE PREFERRED EMBODIMENT

Figure 1:
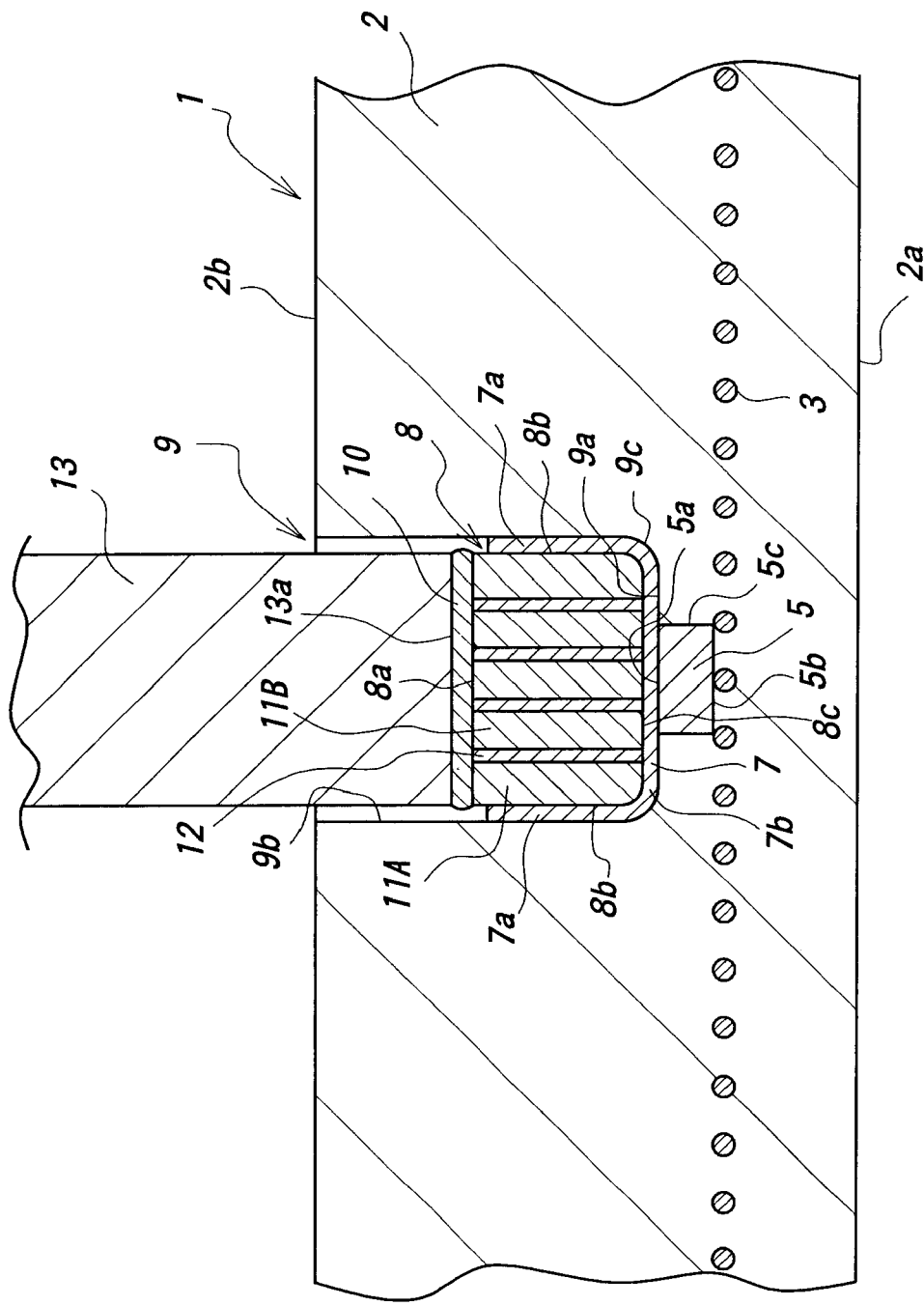
FIG. 1 is a cross sectional view showing one embodiment of a joint structure according to the invention.
Figure 2A:
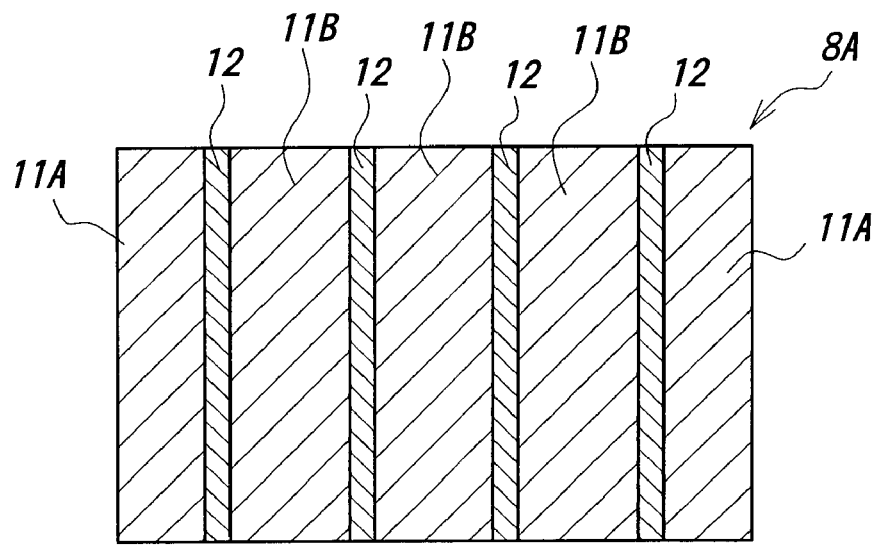
FIG. 2a is a cross sectional view illustrating an intermediate insertion member 8A to which a chamfer working is not applied.
Figure 2B:
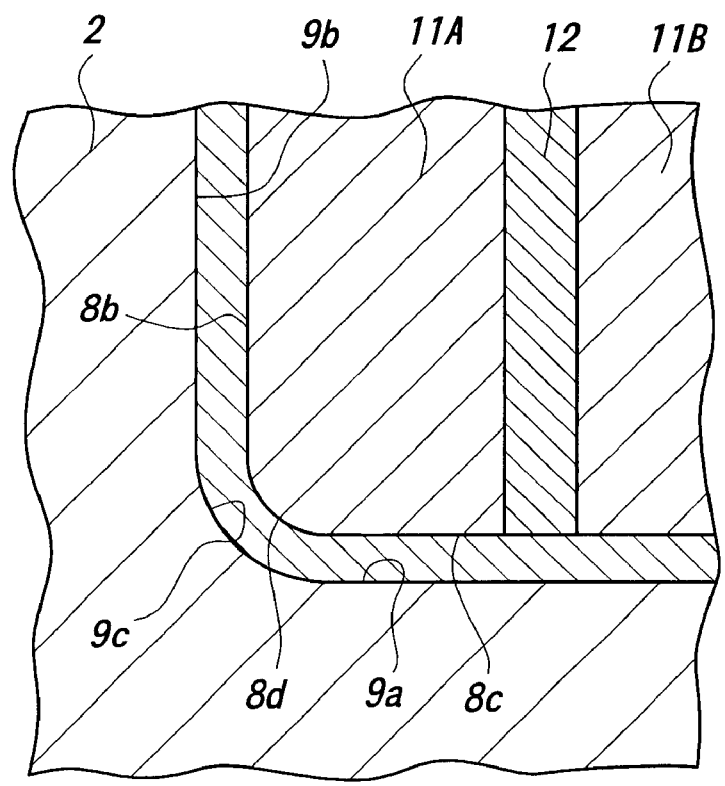
FIG. 2b is an enlarged cross sectional view depicting a portion near a corner portion 9 of an accommodation hole and a corner portion 8d of an intermediate insertion member 8, to which a chamfer working is applied.

At first, the present invention will be explained with reference to FIGS. 1, 2a and 2b. FIG. 1 is a cross sectional view showing one embodiment of a joint structure according to the invention. FIG. 2a is a cross sectional view illustrating an intermediate insertion member 8A before a chamfer working, and FIG. 2b is an enlarged cross sectional view depicting a portion near a corner portion of an intermediate insertion member 8 and a corner portion of an accommodation hole. In this embodiment, a first member is a susceptor 1 and a second member is a connector 13 for power supply.

An electrode 3 is embedded in a disc-shaped ceramics substrate 2. A numeral 2a is a surface to which semiconductor wafer or flat panel display is set, and a numeral 2b is a rear surface. The electrode 3 is formed by for example metal wire or mesh. An accommodation hole 9 is formed in the substrate 2 at a side of the rear surface 2b. The mesh electrode 3 is embedded in the substrate 2, and a terminal 5 made of molybdenum or molybdenum alloy is also embedded. It is preferred that the terminal 5 is formed by a bulk body made of molybdenum or molybdenum alloy or a sintered body made of powders of molybdenum or molybdenum alloy from the view point of high melt point. One surface 5a of the terminal 5 is exposed to a bottom surface 9a of the accommodation hole 9, and the other surface 5b of the terminal 5 is contacted to the metal electrode 3. A numeral 5c is a side surface.

The intermediate insertion member 8 and a tip portion of the second member 13 are accommodated in the accommodation hole 9. A bottom surface 8c of the intermediate insertion member 8 is joined to an exposed surface 5a of the terminal 5 by means of a bottom portion 7b of a first joint layer 7. Moreover, a slight space is arranged between a side surface 8b of the intermediate insertion member 8 and a side surface 9b of the accommodation hole 9, and a side peripheral portion 7a of the first joint layer 7 is filled in this space. The first joint layer 7 is extended to a portion near an upper surface 8a of the intermediate insertion member 8. The upper surface 8a of the intermediate insertion member 8 is joined to an end surface 13a of the second member 13 by means of a second joint layer 10.

The intermediate insertion member 8 or 8A shown in FIG. 1 or FIG. 2a comprises a plurality of ceramic layers 11A, 11B and metal layers 12 formed between respective ceramic layers 11A and 11B or 11B and 11B. In the outermost two ceramic layers 11A of the intermediate insertion member 8 or 8A, one main surface is exposed and the other main surface is contacted to the metal layer 12. Respective ceramics layers and respective metal layers are integrated.

In this embodiment, use is made of the intermediate insertion member 8A shown in FIG. 2a before the chamfer working as it is, but it is preferred that the chamfer working is performed for a corner portion 8d of the intermediate insertion member 8 as shown in FIG. 2b.

As mentioned above, the intermediate insertion member having a laminated structure of a plurality of ceramics layers and at least one metal layer basically has a substantially same thermal expansion property as that of ceramics. Therefore, it is possible to prevent a crack generation in the first joint layer 7 due to a deviation of thermal expansion property or thermal shrinkage property from the first member 1 and also prevent a crack generation in the intermediate insertion member. In addition, in the intermediate insertion member 8 and 8A, ceramics layers 11A and 11B are separated with each other by the metal layers. Therefore, when a stress due to a difference of thermal expansion property or thermal shrinkage property from the first member is applied thereto, it is possible to disperse such a stress. Moreover, even if a crack is generated in one ceramic layer, the ceramic layer having a crack is separated from the other ceramic layers. Therefore, the joint portion is not fractured.

In the intermediate insertion member, if a thickness of the ceramics layer is larger than 0.5 mm, a thickness of the metal layer is smaller than 0.2 mm, and a ratio of a thickness of the metal layer with respect to that of the ceramics layer is smaller than $\frac{1}{3}$, preferably $\frac{1}{5}$, more preferably $\frac{1}{10}$, it is possible to obtain a remarkable thermal expansion reduction due to the intermediate insertion member.

Moreover, from the view points of an inner stress reduction in respective ceramics layers and a sure prevention of crack generation, it is preferred that a thickness of respective metal layers is larger than 1 mm and a thickness of the ceramic layer is smaller than 0.5 mm.

In the preferable embodiment according to the invention, as shown in for example FIG. 1, the second member 13 and the metal embedded member 5 are conducted electrically at least via the first joint layer 7 and the metal layer 12. That is to say, the intermediate insertion member 8 or 8A functions to perform an electric conduction together with a stress reduction due to a difference of thermal expansion property.

In this case, it is possible to control accurately an inner electric resistance of the intermediate insertion member by varying a thickness of respective metal layers 12. Then, in the case that a plurality of metal layers are arranged in the intermediate insertion member, even if an electric conduction is stopped in one metal layer, an electric conduction of the intermediate insertion member can be maintained by, the other metal layers. In order to obtain the effect mentioned above, it is preferred to arrange four or more metal layers. In addition, it is preferred that a direction of respective metal layers in the intermediate insertion member is substantially perpendicular with respect to a joint surface 9a of the accommodation hole 9.

Moreover, in the preferred embodiment according to the invention, as shown in for example FIG. 1, the accommodation hole 9 is formed in the first member 1 and the metal embedded member is exposed to the bottom surface 9a of the accommodation hole 9. In addition, the intermediate insertion member 8 and at least a part of the second member 13 are accommodated in the accommodation hole 9, and the first joint layer 7 is arranged continuously from a portion between the bottom surface 8c of the intermediate insertion member 8 and the bottom surface 9a of the accommodation hole 9 to a portion between the side surface 8b of the intermediate insertion member 8 and the side surface 9b of the accommodation hole 9. Further, the second joint layer 10 may be arranged between the upper surface 8a of the intermediate insertion member 8 and the second member 13.

The intermediate insertion member according to the invention has substantially same thermal expansion property as that of ceramics as mentioned above, and respective ceramics layers are separated by the metal layers. Therefore, it is possible to reduce an inner stress in the ceramics layer. In this case, even when the joint layer is arranged at not only the bottom surface of the intermediate insertion member but also the side surface thereof, it is possible to prevent a crack generation in the joint layer. Moreover, if the joint layer is further arranged at a portion between the side surface of the intermediate insertion member and the side surface of the accommodation hole in this manner, a joint distance of the joint layer can be prolonged. Therefore, a joint strength between the first member and the second member can be extremely improved. In addition, the metal embedded member can be protected against the outer atmosphere particularly oxygen atmosphere or corrosive gas atmosphere.

In the preferred embodiment according to the invention, as shown in FIG. 2b by the cross section of the joint structure, a curvature radius of a corner portion 9c of the accommodation hole 9 between the bottom surface 9a and the side surface 9b is 1–2 times larger than that of a corner portion 8d of the intermediate insertion member 8 between the bottom surface 8c and the side surface 8b. In this case, a thickness variation of a space between the intermediate insertion member and the accommodation hole, that is, a thickness variation of the joint layer becomes smaller at respective corner portions. Therefore, a region between both corner portions 9c and 8d does not become an origin of crack generations. It is preferred that the curvature radius of the intermediate insertion member 8 between the bottom surface 8c and the side surface 8b is 0.3–1.0 mm.

As the first member, use is made of various devices such as a heater in which a resistance heater is embedded in a ceramics substrate, an electrostatic chuck in which an electrode for an electrostatic chuck is embedded in a ceramics substrate, a heater with an electrostatic chuck in which a resistance heater and an electrode for an electrostatic chuck are embedded in a ceramics substrate, an electrode device for a high frequency generation in which an electrode for a plasma generation is embedded in a ceramic substrate, and an electrode device for a high frequency generation in which an electrode for an electrostatic chuck is embedded in a ceramics substrate. In these devices mentioned above, it is necessary to arrange a connector for an electric power supply for supplying an electric power to the electrode in the ceramics substrate.

In the case that a metal electrode is embedded, it is preferred to use the metal electrode in a form of a planar metal bulky member. Here, a term "planar metal bulky member" means not only a planar integral metal shaped body but also a wire or a planar body arranged in a spiral or zigzag form.

As the planar bulky member, the following may be employed:

(1) A planar bulky member made of a thin plate; and
(2) A planar bulky electrode member in which a plurality of small openings are formed. This includes a bulky member made of a planar material having numerous small holes, and a netlike bulky member. As the planar member having numerous small holes, a punched metal may be used.

Normally, since the metal embedded member (particularly the electrode) is sintered together with ceramics powders such as alumina powders or aluminum nitride powders, it is preferred to form the metal electrode by a metal having high melting point. As such a metal having high melting point, tantalum, tungsten, molybdenum, platinum, rhenium, hafnium and their alloys may be recited. From the view point of preventing semiconductor contamination, it is further preferred to use tantalum, tungsten, molybdenum, platinum and their alloys.

From the view point of further improving the effects of the invention, it is preferred that a difference of thermal expansion coefficient between ceramics constituting the ceramics layer of the intermediate insertion member and ceramics constituting the substrate is within 20%. Such ceramics mentioned above is not limited, but it includes aluminum nitride, silicon nitride, silicon carbide, sialon, and alumina.

As the first joint layer and the second joint layer, it is preferred to use a brazing material including a metal element selected from the group of gold, aluminum, silver, copper, nickel, platinum and palladium, as a main ingredient, and it is particularly preferred to use a brazing material including one or more metals selected from the group of gold, platinum and palladium, as a main ingredient. These metals occupy more than 50 wt % in all the metals of the joint layer. Moreover, it is preferred that these metals occupy more than 70 wt % and more preferably 80 wt %. From the view point of oxidation resistance, it is most preferred to use gold as the main ingredient of the first joint layer and the second joint layer.

In the joint layer, it is preferred to include one or more active metals selected from the group of titanium, zirconium, hafnium, vanadium, niobium and magnesium. In this case, it is possible to increase adhesion property and joint strength of the joint layer with respect to ceramics. Moreover, it is possible to include one or more third components selected from the group of Si, Al, Cu and In.

Here, if an amount of active metal is not larger than 0.3 wt %, a wettability becomes bad and there is a case such that a joining operation is not performed. Moreover, if an amount of active metal is not smaller than 20 wt %, a reaction layer at a joint boundary becomes thick and there is a case such that a crack is generated. Therefore, it is preferred that an amount of active metal is 0.3–20 wt %. Further, if an amount of third component is not smaller than 50 wt %, an intermetallic compound increases and there is a case such that a crack is generated at the joint boundary. Therefore, it is preferred that an amount of third component is smaller than 50 wt %.

Moreover, it is preferred to include 5–50 wt % of nickel in the joint layer. In the case that nickel including alloy or nickel is used as the metal joint member in this manner, a large amount of dissolution into the joint layer can be decreased. In this case, a seal property of the embedded terminal after joining can be improved.

As the metal layer constituting the intermediate insertion member, it is preferred to use the brazing material mentioned above having the metal element selected from the group of gold, aluminum, copper, silver, nickel, platinum and palladium, as a main ingredient. Further, in the brazing material, it is preferred to include one or more active metals selected from the group of titanium, zirconium, hafnium and niobium.

As the second member particularly connector for power supply, it is preferred to use a metal having high corrosion resistance with respect to an atmosphere, that is, it is preferred to use pure nickel, nickel based heat resistant alloy, gold, platinum, silver, aluminum and their alloys.

In order to manufacture the intermediate insertion member 8A shown in FIG. 2a, sheets of the brazing material are interposed between respective ceramics layers 11A and 11B or 11B and 11B, and a heat treatment is subjected thereto at a temperature higher than a melting point of the brazing material.

In one embodiment according to the invention, spacers are inserted in the metal layers so as to adjust a space between adjacent ceramics layers. Hereby, it is possible to maintain the spaces between respective ceramic layers constantly and thus it is possible to prevent an unevenness of stress.

Figure 3:
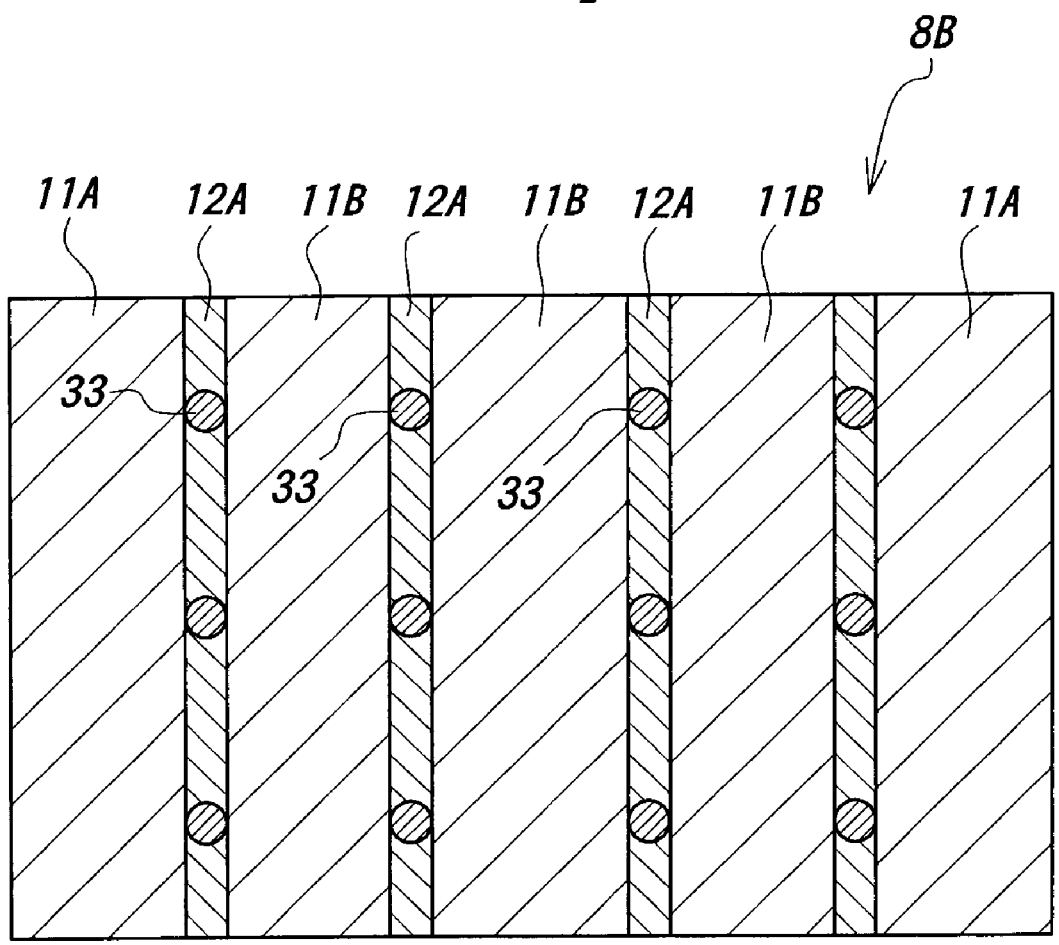
FIG. 3 is a cross sectional view showing another embodiment of an intermediate insertion member 8B in which spacers 33 are inserted in respective metal layers 12A.

An intermediate insertion member 8B shown in FIG. 3 relates to this embodiment mentioned above. In this embodiment, metal layers 12A are arranged between respective ceramics layers 11A and 11B or 11B and 11b, and linear spacers 33 having a predetermined diameter are inserted in respective metal layers 12A. This space has preferably a linear shape, but spherical spacers may be used. Moreover, as the spacer, it is preferred to use a metal which has a melting point higher than that of the brazing material and which is hardly dissolved in a melted brazing material. For example, in the case that use is made of an aluminum brazing material, it is preferred to use a nickel wire as the spacer. Moreover, in the case that use is made of a gold brazing material, it is preferred to use a platinum wire or a nickel wire as the spacer.

A method of manufacturing the joint structure mentioned above will be explained. Preferably, as shown in FIG. 4, a formed body 30 made of ceramics raw materials is prepared, and the thus prepared formed body 30 is sintered. The mesh metal electrode 3 and a formed body 15 made of metal powders are embedded in the formed body 30. The formed body 15 is sintered together with the sintering of the formed body 30 so as to obtain the terminal 5 made of powder sintered body.

Figure 5A:
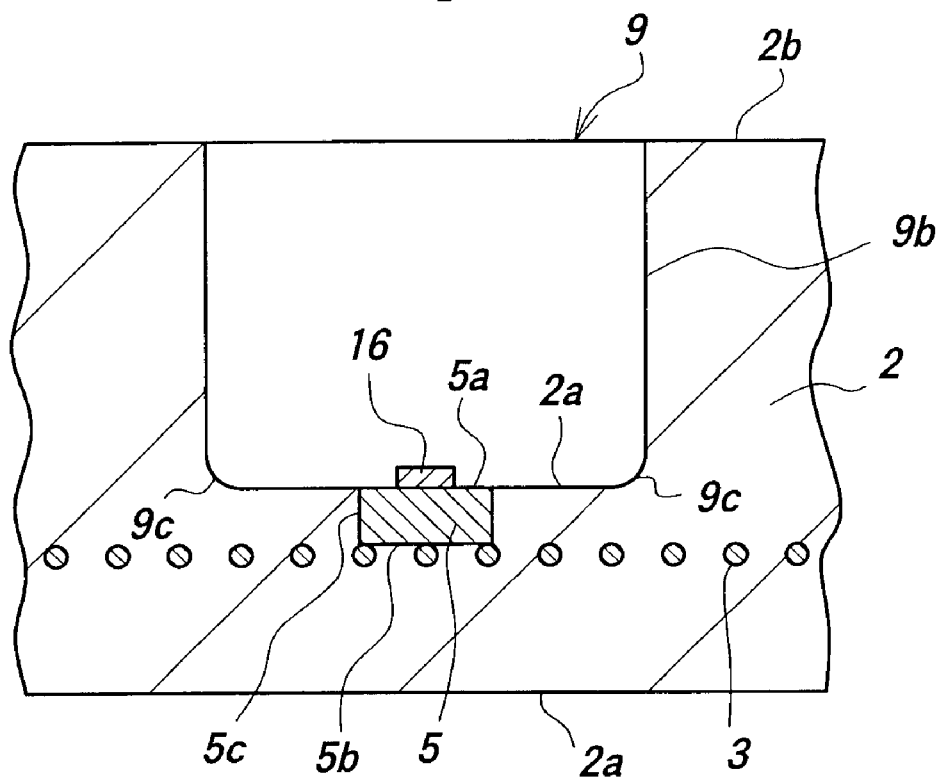
FIG. 5a is a cross sectional view depicting a state such that an accommodation hole 9 is formed in a first member 1 and a metal foil 16 is provided on a terminal 5.
Figure 5B:
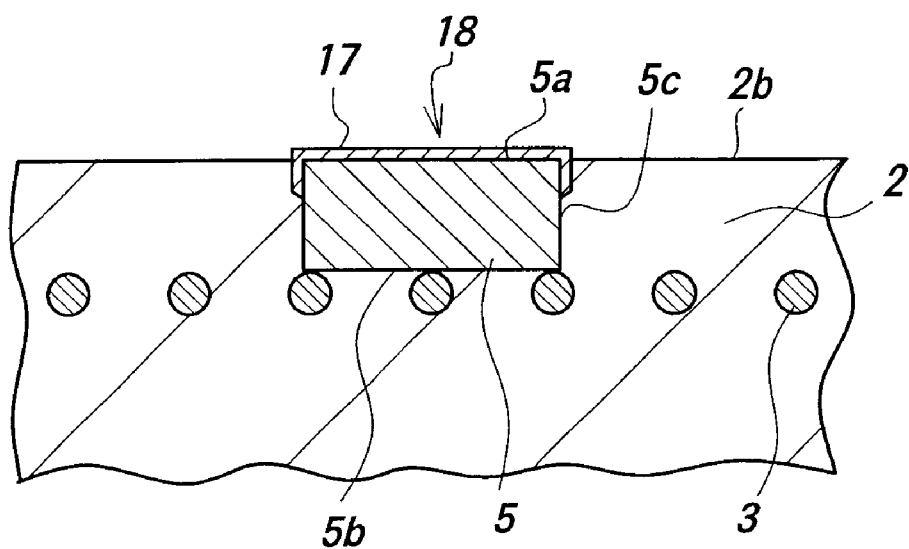
FIG. 5b is an enlarged cross sectional view showing a terminal 18 having a film 17.

Then, a grinding operation is subjected to the rear surface 2b and the accommodation hole 9 is formed as shown in FIG. 5a. In this case, a metal foil 16 made of gold, platinum or palladium may be arranged on a surface 5a of the terminal 5 and it may be heated. Thereby, a terminal 18 is formed after heating, as shown in FIG. 5b. In the terminal 18, a film 17 not only covers all the surface 5a of the terminal 5 but also inserts in a part of a slight space between a side surface 5c of the terminal 5 and the ceramics substrate 2.

Then, a brazing material sheet for the first joint layer 7, the intermediate insertion member 8, a brazing material sheet for the second joint layer 10 and the second member 13 are arranged in the accommodation hole 9 at their predetermined positions, and they are heated under non-oxidative condition. In this manner, the joint structure shown in FIG. 1 can be obtained. Here, the non-oxidative condition mentioned above means a vacuum atmosphere of a non-oxidative atmosphere (preferably an inert atmosphere).

In the preferred embodiment according to the invention, the joint structure has a structure such that: the second member has a main portion and an expanding portion arranged at a tip of the main portion which is accommodated in the accommodation hole; a bottom surface of the expanding portion is joined to the intermediate insertion member via the second joint layer; and a thermal expansion reducing member made of ceramics is joined to an upper surface of the expanding portion. In this case, it is possible to reduce a difference of thermal expansion coefficient between the intermediate insertion member and the second member made of metal more effectively.

Figure 6:
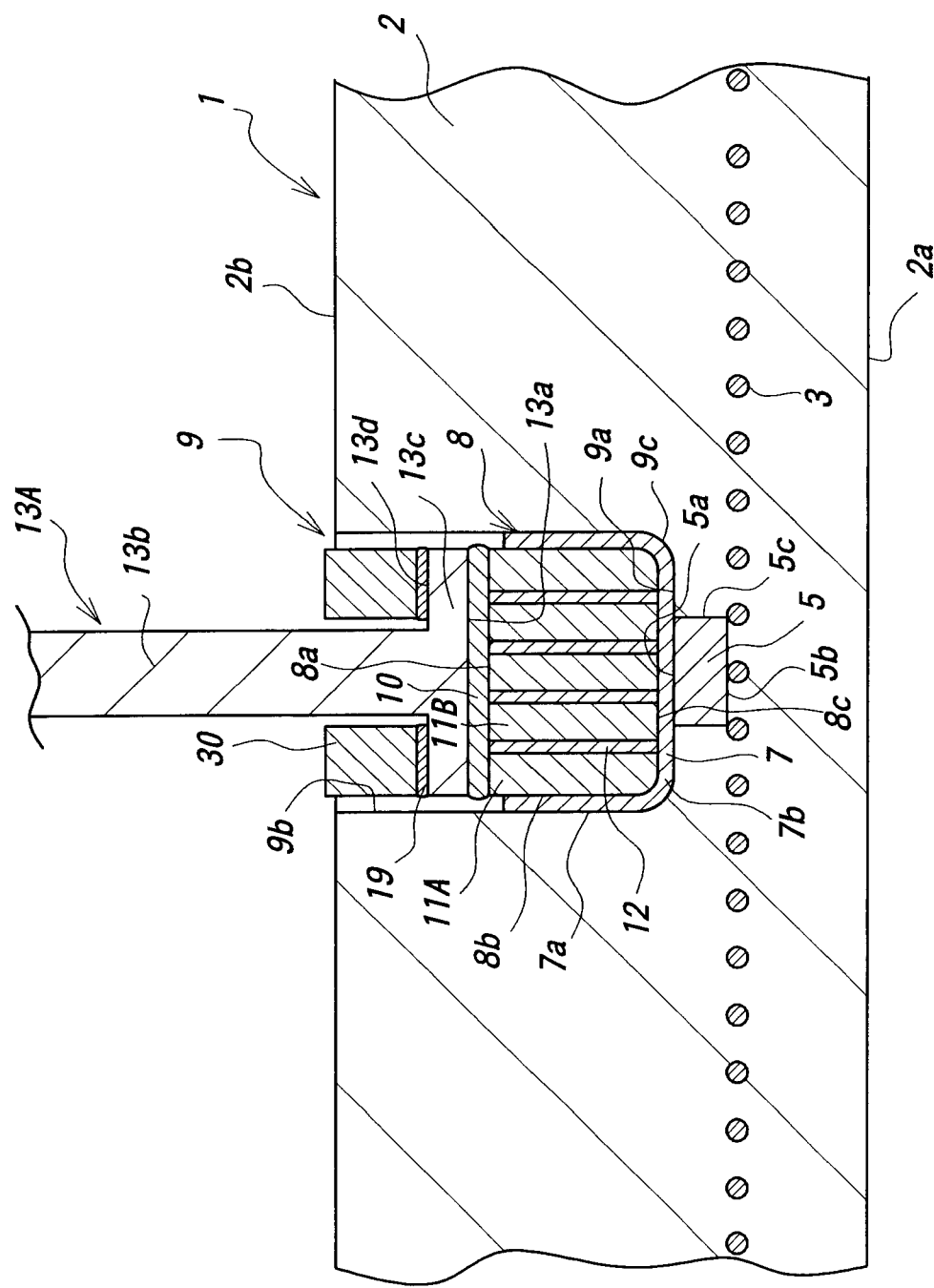
FIG. 6 is a cross sectional view illustrating another embodiment of the joint structure according to the invention in which a thermal expansion reducing member 30 is provided.

FIG. 6 is a cross sectional view showing the joint structure according to this embodiment mentioned above. In FIG. 6, portions similar to those of FIG. 1 are denoted by the same reference numerals as those in FIG. 1, and the explanations thereof are omitted here. Shapes of the accommodation hole 9, the intermediate insertion member 8 and so on are the same as those of FIG. 1. A second member 13A comprises a rod-shaped main portion 13b and an expanding portion 13c arranged at a tip of the main portion 13b. The second joint layer 10 is arranged between a bottom surface 13a of the expanding portion 13c and the upper surface 8a of the intermediate insertion member 8. On an upper surface 13d of the expanding portion 13c, for example, a cylindrical thermal expansion reducing member 30 is arranged, and the thermal expansion reducing member 30 is joined to the upper surface 13d via a joint layer 19.

It is preferred that the thermal expansion reducing member 30 is formed by the same ceramics as that of the substrate 2 or the ceramics layers 11A, 11B. Moreover, it is preferred that a difference of thermal expansion coefficient between the thermal expansion reducing member 30 and the ceramics layers 11A, 11B is within 20%. Further, it is preferred that the joint layer 19 is formed by the brazing materials mentioned above.

Figure 7:
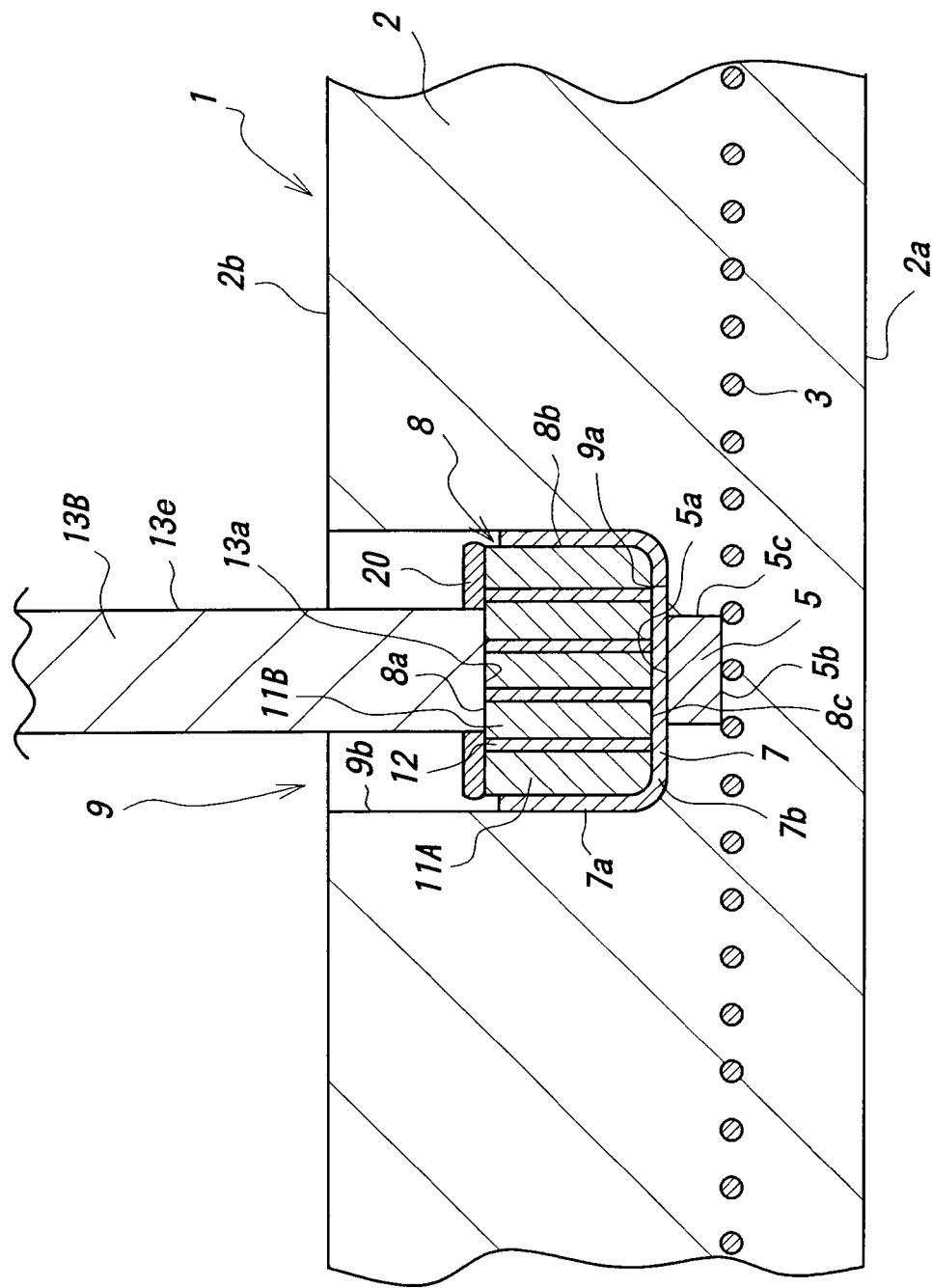
FIG. 7 is a cross sectional view depicting still another embodiment of the joint structure according to the invention.

Moreover, it is preferred that the second joint layer is arranged between the second member and the intermediate insertion member, but this situation is not always necessary. FIG. 7 is a cross sectional view showing this embodiment mentioned above. Shapes of the accommodation hole 9, the intermediate insertion member 8 and so on are same as those of FIG. 1. A second member 13B has a rod shape. The bottom surface 13a of the second member 13B is directly joined to the upper surface 8a of the intermediate insertion member 8 without arranging the joint layer. The second joint layer 20 is formed on the upper surface 8a of the intermediate insertion member 8 in such a manner that it is also contacted to a side surface 13e of the second member 13B. In this case, the second member 13B is fixed to the intermediate insertion member 8 by means of the second joint layer 20 from a side of the side surface 13e. In this manner, the joint layer is not arranged between the second member 13B and the intermediate insertion member 8, and thus it is possible to reduce a stress applied to the brazing material due to the joint layer.

In the preferred embodiment according to the invention, the second member is formed by a cylindrical formed member and an end surface of the cylindrical formed member is joined to the intermediate insertion member via the second joint layer. In this case, it is possible to further reduce a stress due to a thermal expansion difference between the second member and the intermediate insertion member by forming the second member made of metal by the cylindrical formed member and by joining an edge surface of the cylindrical formed member to the intermediate insertion member.

In this embodiment, it is particularly preferred that the thermal expansion reducing member made of ceramics is accommodated inside of the cylindrical formed body and that an inner wall surface of the cylindrical formed body is joined to an outer wall surface of the thermal expansion reducing member.

Figure 8:
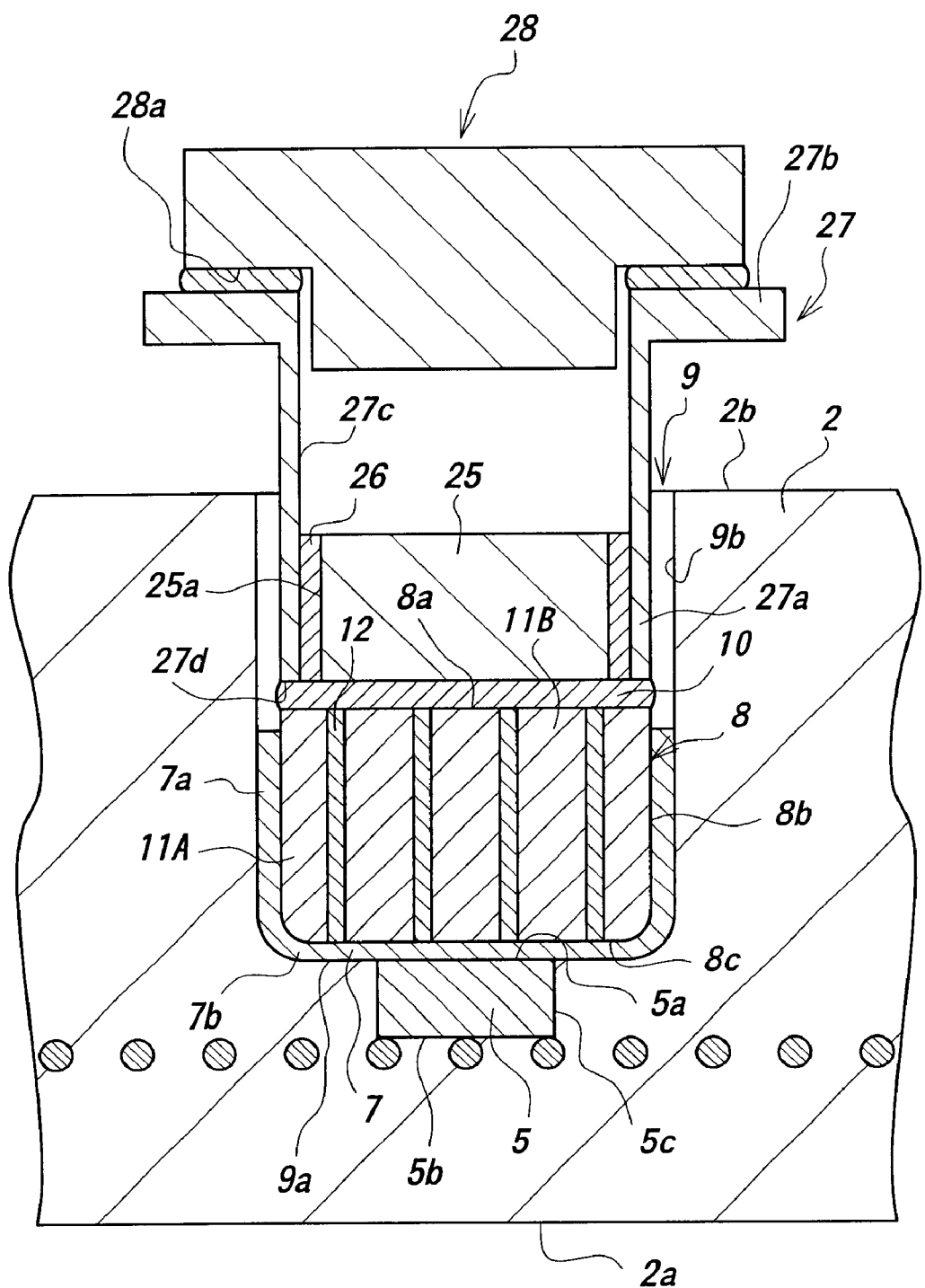
FIG. 8 is a cross sectional view showing still another embodiment of the joint structure according to the invention in which an end surface of a cylindrical formed body 27 is joined to the intermediate insertion member and a thermal expansion reducing member 25 is accommodated inside of the cylindrical formed body 27.

FIG. 8 is a cross sectional view showing the joint structure according to this embodiment mentioned above. Shapes of the intermediate insertion member 8, the accommodation hole 9 and so on are same as those of FIG. 1. In this embodiment, a main portion 27a of a cylindrical formed body 27 is accommodated in the accommodation hole 9, and an end surface 27d of the main portion 27a is joined to the upper surface 8a of the intermediate insertion member 8 via the second joint layer 10. Moreover, a flange portion 27b having an outer diameter larger than that of the main portion 27a is arranged to an upper end portion of the cylindrical formed body 27. The flange portion 27b is joined to a surface 28a of a cable fix member 28 by means of welding and so on. Further, a thermal expansion reducing member 25 having for example a disc shape is accommodated inside of the cylindrical formed body 27, and an outer wall surface 25a of the thermal expansion reducing member 25 is joined to an inner wall surface 27c of the cylindrical formed body 27 via a joint layer 26. As the joint layer 26, it is preferred to use the brazing materials mentioned above.

In the preferred embodiment according to the invention, the joint structure has a structure such that: the accommodation hole is formed in the first member; the metal embedded member is exposed to a bottom surface of the accommodation hole; the intermediate insertion member and at least a part of a cylindrical atmosphere protection member are accommodated in the accommodation hole; the intermediate insertion member and at least a part of the second member are accommodated inside of the cylindrical atmosphere protection member; the bottom surface of the second member is joined to the intermediate insertion member via the second joint layer; and the intermediate insertion member and the cylindrical atmosphere protection member are joined to the bottom surface of the accommodation hole via the first joint layer. Thereby, it is possible to improve heat resistance, corrosion resistance and oxidation resistance properties of the joint structure and to maintain an excellent conduction property.

Figure 9:
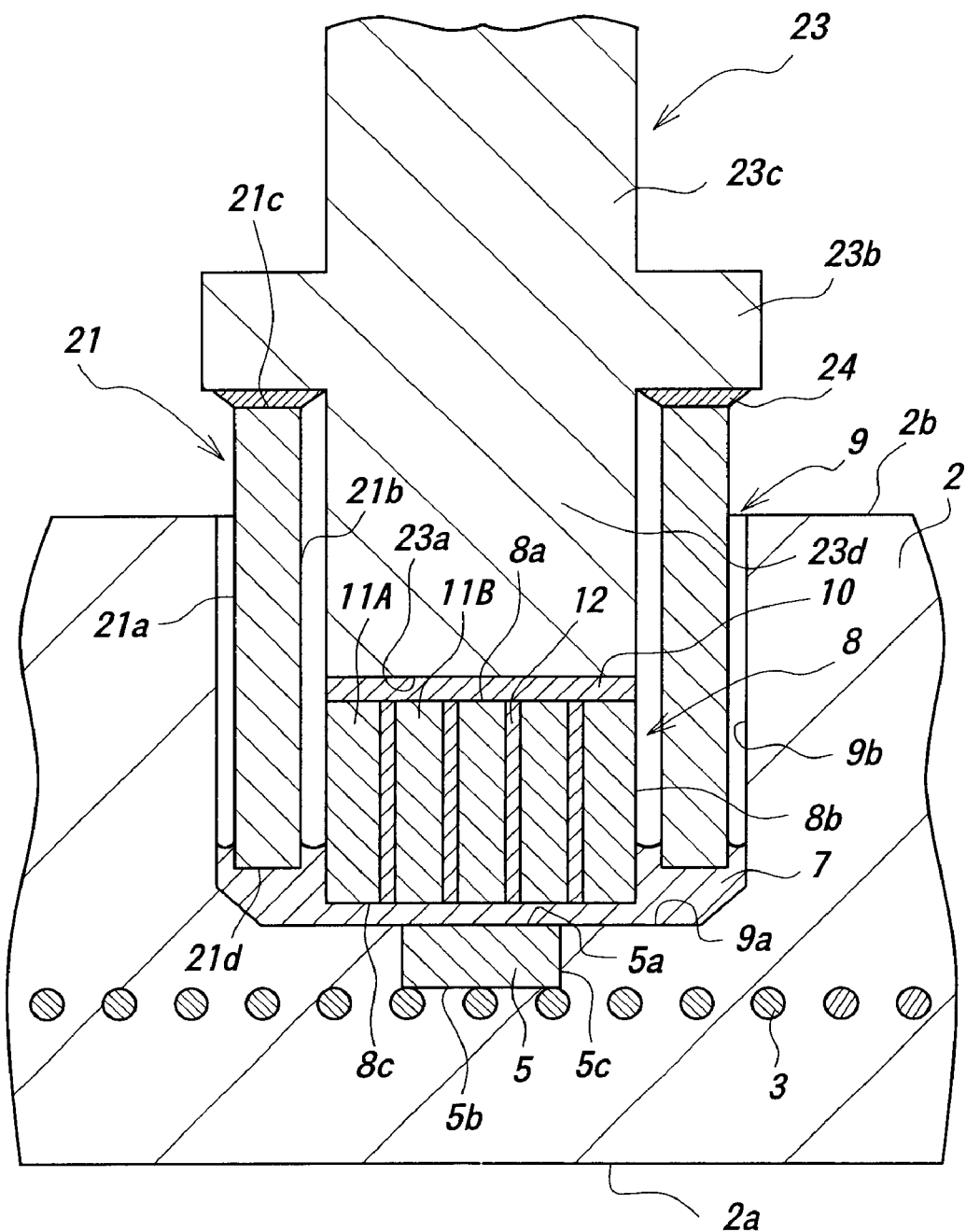
FIG. 9 is a cross sectional view illustrating still another embodiment of the joint structure according to the invention in which the intermediate insertion member 8 is accommodated inside of a cylindrical atmosphere protection member 21.

FIG. 9 is a cross sectional view showing the joint structure according to this embodiment of the invention mentioned above. In this embodiment, an atmosphere protection member 21 having for example a cylindrical shape is inserted in the accommodation hole 9. A slight space is arranged between an outer side surface 21a of the atmosphere protection member 21 and the inner wall surface 9b of the accommodation hole 9. The intermediate insertion member 8 having for example a disc shape is accommodated inside of the atmosphere protection member 21 at its lower space.

The under surface 8c of the intermediate insertion member 8 and an end surface 21d of the cylindrical atmosphere protection member 21 are joined in an airtight state to the bottom surface 9a of the accommodation hole 9 via the first joint layer 7.

A second member 23 comprises a main portion 23c arranged outside of the accommodation hole 9, a cylindrical flange portion 23b and a tip portion 23d, and the tip portion 23d is accommodated in the atmosphere protection member 21. A slight space is arranged between (a) an inner wall surface 21b of the atmosphere protection member 21 and (b) the intermediate insertion member 8 and the tip portion 23d. A conductive joint layer 24 preferably made of the brazing materials mentioned above is arranged between an upper surface 21c of the atmosphere protection member 21 and the flange portion 23b. In addition, the conductive second joint layer 10 is arranged between a bottom surface 23a of the tip portion 23d and the upper surface 8a of the intermediate insertion member 8.

According to the joint structure mentioned above, the cylindrical atmosphere protection member 21 is accommodated in the accommodation hole 9, the intermediate insertion member 8 is arranged inside of the atmosphere protection member 21 at its lower portion, and the tip portion 23d is inserted on the upper surface of the intermediate insertion member 8. Therefore, it is possible to completely cover and protect respective metal layers 12 constituting the intermediate insertion member 8 by means of the atmosphere protection member 21.

In addition, in the intermediate insertion member 8, an electric conduction is performed by flowing a current through a plurality of metal layers 12 simultaneously. Therefore, it is possible to flow a large current such as larger than 30A easily.

Moreover, there are a current flow line through the tip portion 23d of the second member 23, the conductive second joint layer 10, respective metal layers 12 of the intermediate insertion member 8 and the first joint layer 7, and a current flow line through the flange portion 23b, the conductive joint layer 24, the atmosphere protection member 21 and the first joint layer 7. Since there are two current flow lines as mentioned above, it is possible to increase an amount of power supply to the electrode 3 more and more and to stabilize the power supply.

As to a joining of the second joint layer 10 and the intermediate insertion member 8, there is one method (1) such that a brazing material including active metals is used for the second joint layer 10 and that the ceramic layers 11A, 11B and the metal layers 12 are joined to the brazing material mentioned above. Moreover, there is another method (2) such that a brazing material excluding active metals is used for the second joint layer 10 and that only the metal layers 12 are joined to the brazing material mentioned above. In the case (2), since a residual stress applied to the intermediate insertion member 8 is low, a fracture due to the residual stress hardly occurs.

Figure 10:
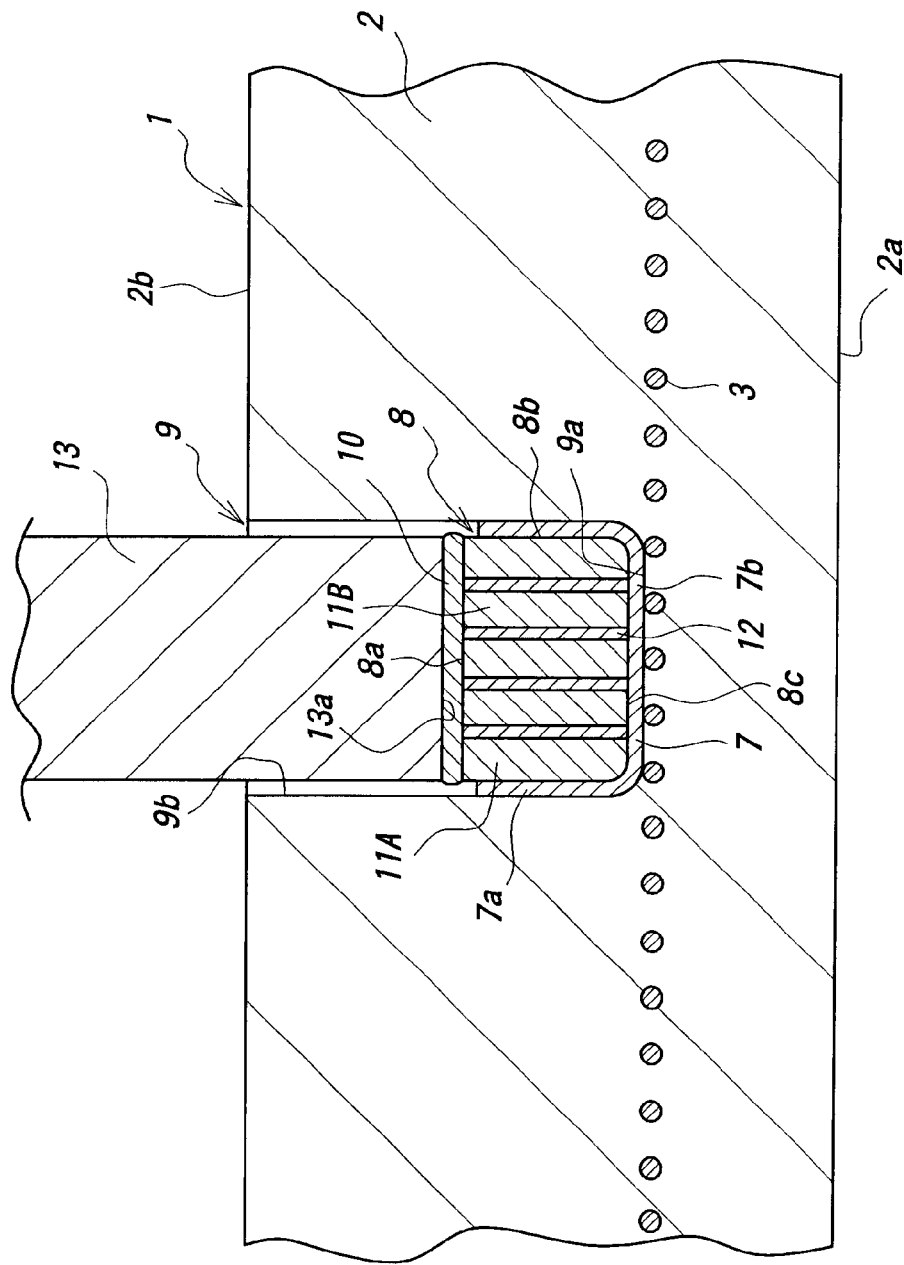
FIG. 10 is a cross sectional view depicting still another embodiment of the joint structure in which a bottom surface of the intermediate insertion member 8 is joined to the metal electrode 3.

The joint structure shown in FIG. 10 is similar to that of FIG. 1. In the joint structure shown in FIG. 10, the terminal 5 is not embedded in the substrate 2, and the metal electrode 3 is directly exposed to the bottom surface 9a of the accommodation hole 9. Therefore, the bottom surface 8c of the intermediate insertion member 8 is joined to the metal electrode 3 that is exposed to the bottom surface 9a and the ceramics via the first joint layer 7.

Hereinafter, actual embodiments will be explained.

(Manufacturing of the first Member 2)

According to the method shown in FIG. 4 and FIG. 5a, the first member 2 shown in FIG. 9 was manufactured. At first, the formed body 30 shown in FIG. 4 was manufactured by subjecting aluminum nitride powders to a uniaxial pressurized forming. As the metal electrode 3, use was made of a metal mesh made of molybdenum. The metal mesh had a structure such that molybdenum wire having a diameter of 0.12 mm was knitted at a density of 50/inch. The metal mesh 3 was embedded in a preliminary formed body. In addition, the formed body 15 was prepared by forming molybdenum powders having a particle size of 1–100 $\mu$m, and the thus prepared formed body 15 was also embedded in the formed body 30.

The thus prepared formed body 30 was set in a hot-press apparatus under such a condition that it was tightly sealed by a carbon foil. Then, the formed body 30 was sintered at a temperature of 1950° C. and a stress of 200 kg/cm² for 2 hours by means of the hot-press apparatus to obtain a sintered body. A relative density of the sintered body was 98.0% or more.

The accommodation hole 9 was formed from a side of rear surface of the thus obtained sintered body by using a machining center to form a specimen of the first member. Here, the specimen was rectangular shape and had a dimension of lengthwise: 20 mm×breadthwise: 20 mm×thickness: 10 mm.

(Manufacturing of the Intermediate Insertion Member 8)

As shown in FIG. 1 and FIG. 2a, the intermediate insertion member 8 was manufactured. At first, five planar ceramic layers made of aluminum nitride and four gold brazing sheets (Au-18Ni-1Ti) were laminated alternately. The ceramic layer had a dimension of 20 mm×10 mm×0.1 mm, and the gold brazing sheet had a dimension of 20 mm×10 mm×0.1 mm. The thus prepared laminated member was heated at 980° C. for 10 minutes under such a condition that a weight of 250 g was applied. Then, the laminated body was worked to obtain the disc-shaped intermediate insertion member 8A having a diameter of 4.7 mm and a thickness of 2.0 mm (referred to FIG. 2a).

Then, the corner portions of the intermediate insertion member 8A were worked while checking by handy type drill to obtain the intermediate insertion member 8.

(Joining)

Two gold brazing sheets (Au-18Ni-1Ti) (thickness of 0.1 mm) were set on the bottom surface 9a of the accommodation hole 9, and the intermediate insertion member 8 and the protection member 21 were set thereon. The protection member 21 was made of kovar. One gold brazing sheet (Au-18N-1Ti) (thickness of 0.1 mm) was set on the upper surface of the intermediate insertion member 8, and the second member 23 made of nickel was set thereon. The gold brazing sheet (Au-18Ni-1Ti)(thickness of 0.1 mm) was also arranged between the upper surface 21c of the protection member 21 and the flange portion 23 to obtain an assembled body. Then, the thus obtained assembled body was heated at 980° C. for 10 minutes under such a condition that a weight of 250 g was applied thereto to obtain the joint structure shown in FIG. 9.

A stress was applied to the main portion 23c of the second member 23 in a direction parallel to the rear surface 2b at a portion 30 mm apart from the accommodation hole 9. As a result, when a stress of 30 kgf was applied, the second member 23 made of nickel was largely deformed, and a stress larger than 30 kgf could not be applied. At this stage, a fracture did not occur at the joint portion.

Moreover, with respect to the joint structure, heat cycles between 100° C. and 700° C. were applied 50 times. Here, a temperature ascending rate and a temperature descending rate were about 200° C./min. respectively. After that, the stress applying test mentioned above was performed in the same manner. As a result, as is the same as the test result mentioned above, when a stress of 30 kgf was applied, the second member 23 made of nickel was largely deformed, and a fracture did not occur at the joint portion.

As mentioned above, according to the invention, it is possible to improve a durability against heat cycle and mechanical stress applied to the joint portion.

What is claimed is:

1. A joint structure of a first member, having a substrate made of ceramics and a metal embedded member embedded in the substrate, wherein a part of the metal embedded member is exposed to a joint surface of the first member and a second member made of metal, comprising: an intermediate insertion member interposed between the joint surface of the first member and the second member; a first joint layer which joins the joint surface of the first member and the intermediate insertion member; and a second joint layer which joins the second member and the intermediate insertion member, wherein the intermediate insertion member is made of a laminated member of a plurality of ceramics layers and at least one metal layer interposed between respective ceramics layers.

2. The joint structure according to claim 1, wherein spacers are included in the metal member to adjust a space between adjacent ceramics layers.

3. The joint structure according to claim 1, wherein the second member is conducted electrically to the metal embedded member at least via the first joint layer and the metal layer.

4. The joint structure according to claim 1, wherein the improvement has a structure such that: an accommodation hole is formed in the first member; the metal embedded member is exposed to a bottom surface of the accommodation hole; the first joint layer is arranged continuously from a portion between a bottom surface of the intermediate insertion member and the bottom surface of the accommodation hole to a portion between a side surface of the intermediate insertion member and a side surface of the accommodation hole.

5. The joint structure according to claim 4, wherein a cross section of the joint structure is that a curvature radius of a corner portion of the accommodation hole between the bottom surface and the side surface is 1–2 times larger than that of a corner portion of the intermediate insertion member between the bottom surface and the side surface.

6. The joint structure according to claim 4, wherein the improvement has a structure such that: the second member has a main portion and an expanding portion arranged at a tip of the main portion which is accommodated in the accommodation hole; a bottom surface of the expanding portion is joined to the intermediate insertion member via the second joint layer; and a thermal expansion reducing member made of ceramics is joined to an upper surface of the expanding portion.

7. The joint structure according to claim 4, wherein the second member is formed by a cylindrical formed member and an end surface of the cylindrical formed member is joined to the intermediate insertion member via the second joint layer.

8. The joint structure according to claim 7, wherein a thermal expansion reducing member made of ceramics is accommodated inside of the cylindrical member and an inner wall surface of the cylindrical member is joined to an outer wall surface of the thermal expansion reducing member.

9. The joint structure according to claim 1, wherein the improvement has a structure such that: an accommodation hole is formed in the first member; the metal embedded member is exposed to a bottom surface of the accommodation hole; the intermediate insertion member and at least a part of a cylindrical atmosphere protection member are accommodated in the accommodation hole; the intermediate insertion member and at least a part of the second member are accommodated inside of the cylindrical atmosphere protection member; a bottom surface of the second member is joined to the intermediate insertion member via the second joint layer; and the intermediate insertion member and the cylindrical atmosphere protection member are joined to a bottom surface of the accommodation hole via the first joint layer.

10. The joint structure according to claim 1, wherein the second member is a terminal made of nickel or nickel alloy.

11. The joint structure according to claim 1, wherein a difference of thermal expansion coefficient between ceramics constituting the ceramics layer and ceramics constituting the substrate is within 20%.

12. The joint structure according to claim 1, wherein ceramics constituting the substrate is one or more kinds of ceramics selected from the group consisting of aluminum nitride, alumina and silicon nitride.

13. The joint structure according to claim 1, wherein the metal layer is made of a brazing material including a metal selected from the group consisting of gold, aluminum, silver, copper, nickel, platinum and palladium as a main ingredient.

14. The joint structure according to claim 1, wherein the first joint layer and the second joint layer are made of a brazing material having a metal selected from the group consisting of gold, aluminum, silver, copper, nickel, platinum and palladium as a main ingredient.

15. An intermediate insertion member used for joining a fist member, having a substrate made of ceramics and metal embedded member embedded in the substrate, wherein a part of the metal embedded member is exposed to a joint surface of the first member, and a second member made of metal, comprising a laminated structure of a plurality of ceramics layers and at least one metal layer interposed between respective ceramics layers.

16. The intermediate insertion member according to claim 15, wherein spacers are included in the metal member to adjust a space between adjacent ceramics layers.

17. The intermediate insertion member according to claim 15, wherein the metal layer is made of a brazing material having a metal selected from the group consisting of gold, aluminum, silver, copper, nickel, platinum and palladium.

* * * * *